United States Patent
King et al.

(10) Patent No.: US 10,283,233 B2
(45) Date of Patent: May 7, 2019

(54) BIO-BASED CONFORMAL COATING FOR SULFUR SEQUESTRATION USING POLYHYDROXYALKANOATES

(71) Applicant: International Business Machines Corporation, Armonk, NY (US)

(72) Inventors: Scott B. King, Rochester, MN (US); Brandon M. Kobilka, Tucson, AZ (US); Joseph Kuczynski, North Port, FL (US); Jason T. Wertz, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 15/195,398

(22) Filed: Jun. 28, 2016

(65) Prior Publication Data

US 2017/0372814 A1 Dec. 28, 2017

(51) Int. Cl.
| | |
|---|---|
| *B05D 1/00* | (2006.01) |
| *B05D 3/00* | (2006.01) |
| *B05D 3/04* | (2006.01) |
| *H05K 3/28* | (2006.01) |
| *H05K 5/00* | (2006.01) |
| *H05K 5/06* | (2006.01) |
| *H01B 19/04* | (2006.01) |
| *H01B 3/42* | (2006.01) |

(52) U.S. Cl.
CPC .............. *H01B 3/421* (2013.01); *H01B 19/04* (2013.01); *B05D 1/00* (2013.01); *B05D 3/007* (2013.01); *B05D 3/0433* (2013.01); *H05K 3/28* (2013.01); *H05K 5/0091* (2013.01); *H05K 5/06* (2013.01)

(58) Field of Classification Search
CPC ........ B05D 1/00; B05D 3/007; B05D 3/0433; H05K 3/28; H05K 5/0091; H05K 5/06
USPC .......................................... 427/96.2
See application file for complete search history.

(56) References Cited

U.S. PATENT DOCUMENTS

| | | | |
|---|---|---|---|
| 6,096,810 A * | 8/2000 | Asrar .................. | C08K 5/14 524/80 |
| 7,140,433 B2 | 11/2006 | Gatlin et al. | |
| 9,228,034 B1 | 1/2016 | Boday et al. | |
| 2011/0189381 A1* | 8/2011 | Boday ................. | B32B 27/38 427/58 |
| 2011/0251349 A1* | 10/2011 | Padwa ................. | C08G 63/912 525/190 |

(Continued)

FOREIGN PATENT DOCUMENTS

WO  2009032748 A2  3/2009

OTHER PUBLICATIONS

K. D. Gagnon, R. W. Lenz, R. J. Farris, and R. C. Fuller, Chemical modification of bacterial elastomers: 2. Sulfur vulcanization, 4368 Polymer, vol. 35, No. 20 (1994).

*Primary Examiner* — Brian K Talbot
(74) *Attorney, Agent, or Firm* — Patterson + Sheridan, LLP

(57) ABSTRACT

Embodiments described herein provide methods of processing an electronic component, comprising mixing a bio-based polymer having sulfur-reactive substituents with a sulfurization catalyst and a solvent to form a coating material; applying the coating material to an electronic component; and removing the solvent to form a sulfur-reactive polymer coating that is resistant to sulfur penetration. The bio-based polymer may be made by bacterial fermentation of unsaturated fatty acids.

15 Claims, 1 Drawing Sheet

(56) References Cited

U.S. PATENT DOCUMENTS

| | | | |
|---|---|---|---|
| 2013/0213707 A1* | 8/2013 | Boday | C07F 9/5022 |
| | | | 174/546 |
| 2014/0000955 A1 | 1/2014 | Boday et al. | |
| 2014/0155557 A1 | 6/2014 | Fruth et al. | |
| 2014/0191841 A1 | 7/2014 | Boday et al. | |
| 2015/0132586 A1 | 5/2015 | Mueller | |
| 2015/0343352 A1 | 12/2015 | Boday et al. | |
| 2015/0343421 A1 | 12/2015 | Boday et al. | |
| 2015/0360173 A1 | 12/2015 | Boday et al. | |
| 2017/0275421 A1* | 9/2017 | King | C08G 63/692 |

* cited by examiner

BIO-BASED CONFORMAL COATING FOR SULFUR SEQUESTRATION USING POLYHYDROXYALKANOATES

FIELD

The present disclosure generally relates to polyhydroxyalkanoate flame retardant polymers produced by reactive extrusion processing.

BACKGROUND

The electronics industry designs and tests components to be able to withstand typical environments encountered in data centers. Recently, several equipment failures have occurred in geographies known to exhibit much harsher indoor air environments than the equipment was designed to withstand. Components have failed, for example, due to corrosion of metallurgy via a corrosive gas environment. Attempts to mitigate these failures have focused on the use of commercially available conformal coatings. These conformal coatings fall into one of several generic classes: silicones, epoxies, acrylates, or other organic materials. Accelerated aging testing has revealed that silicones may actually exacerbate the problem due to enhanced solubility and diffusion of corrosive gases in the silicone, whereas studies have revealed that the major culprits in the gaseous environment are elemental sulfur, $H_2S$, or sulfur oxides. Of these, elemental sulfur appears to be the most aggressive. In the case of silicone conformal coatings, research found that they are extremely permeable to the sulfur molecules in the atmosphere and other reduced sulfur species, leading to sulfidation of silver and copper components on the boards. Thus, better coatings are needed for electronic components to withstand environments with sulfur.

SUMMARY

This disclosure describes a method of processing an electronic component, comprising mixing a bio-based polymer having sulfur-reactive substituents with a sulfurization catalyst and a solvent to form a coating material; applying the coating material to an electronic component; and removing the solvent to form a sulfur-reactive polymer coating that is resistant to sulfur penetration.

This disclosure further describes an electronic component coated with a sulfur-reactive polymeric coating resistant to sulfur penetration, the polymeric coating comprising a biopolymer backbone with sulfur-reactive substituents.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1A:
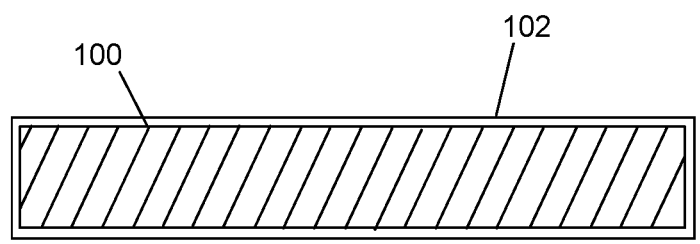
FIG. 1A is a schematic cross-section of an article with a sulfur-reactive coating according to one embodiment.

The present disclosure provides methods of processing electronic components by coating them with bio-based sulfur resistant coatings. The coatings are based on a polymeric material that has sulfur-reactive substituents that can react with environmental sulfur-containing species to form a sulfur-resistant surface that prevents penetration of sulfur species through the coating to the electronic component. The bio-based polymer is a polyester derived from biomass and having sulfur-reactive substituents. One class of such polymers is polyhydroxyalkanoate (PHA) polymers having pendant vinyl groups. Polyhydroxyalkanoates (PHAs) are a family of biopolyesters that may be synthesized by various microorganisms, such as by bacterial fermentation of sugar, lipids, or fatty acids. Polyhydroxyalkanoates are attractive industrially because they are biodegradable, biocompatible, feature a large chemical diversity, and may be produced from renewable resources. A PHA repeat unit has hydroxy acid monomer units with —$CH_2$— groups (x=1, 2) and a side chain R group, as in structure 1:

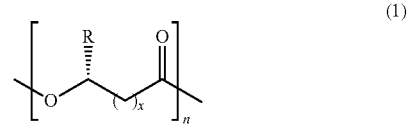

where x is 0, 1, or 2. A PHA of structure 1 with x=1 may also be known as a poly(3-hydroxyalkanoate) because the monomer used to make the PHA has a hydroxyl group at the 3 position with respect to the carbonyl carbon.

The PHAs useful for embodiments described herein have substituents, R groups, that are sulfur-reactive so the coating will react with environmental sulfur at a surface of the coating to form a sulfur-containing exterior layer resistant to further penetration by sulfur. Coatings of this type can be applied to electronic components as environmental barriers to prevent exposure to environmental oxygen, moisture, and sulfur. Not all the R groups of structure 1 need be sulfur-reactive, and the sulfur-reactivity of the PHA may be tuned by adjusting the fraction of sulfur-reactive substituents.

In one example, an (n–1)-alkenoic acid having n carbon atoms and an alkanoic acid are mixed in a weight ratio r of alkenoic acid to total acid, and P. oleovorans added to the mixture to co-polymerize the acids into a polyester. The resulting polyester will have pendant vinyl groups that may be used as described herein to make a sulfur-scavenging coating resistant to sulfur penetration, and will have a ratio of repeat units with vinyl groups to total repeat units of r. Thus, the fraction of the resulting polymer that is sulfur-reactive is r. A higher sulfur-reactive ratio r provides more sulfur scavenging capacity for environments expected to have high ambient sulfur content. A higher ratio r may also enable using less sulfur capturing catalyst. A high ratio r may also result in long-term growth in molecular weight of the coating as vinyl groups not consumed by sulfur gradually cross-link over time. The ratio r may be from above zero, such as 0.01, to 1. In many cases, the ratio r is from 0.25 to 0.95, for example 0.9. In other cases the ratio r is 0.3 to 0.4.

One type of sulfur-reactive substituent that may be used is a vinyl containing substituent such as an alkyl vinyl group, which has the structure $H_2C=CH-(CH_2)_x-$ where x is 2, 4, or 6. The vinyl functionality is capable of reacting with environmental sulfur in the presence of appropriate catalysts to become vulcanized, adding a disulfide linkage between adjacent C=C bonds to form a cross-link. When such groups are disposed in a coating on an electronic component, the sulfur is scavenged from the environment and sequestered, rather than penetrating the polymer material and reacting with materials of the electronic component. The sulfur-containing polymer resulting from absorption of environmental sulfur gradually loses sulfur-reactivity as vinyl groups are consumed by reacting with sulfur at the surface of the polymer, but the sulfurization process hardens the surface to any subsequent sulfur penetration from the environment through cross-linking. Thus, reaction of the polymer with sulfur produces a sulfur-resistant coating.

Sulfur-reactive vinyl groups may be included in PHAs by using feedstocks that provide vinyl groups in the resultant polymer. PHAs may be produced by the *Pseudomonas oleovorans* bacterium metabolizing organic feedstocks that include unsaturation. *P. oleovorans* can polymerize alkanes, alkenes, alkanoates, alkanoic and alkenoic acids, alkanols, and derivatives thereof. Including alkanoic and primary alkenoic acids in the feedstock can result in a polyester product having residual vinyl unsaturation. The resulting polyester has the general structure

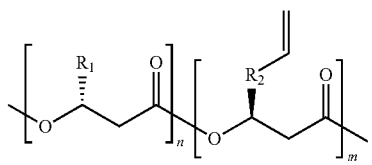

(2)

where $R_1$ and $R_2$ are each short hydrocarbyl chains of 2-7 carbon atoms, and n and m are integers, where m is greater than zero. In this disclosure, the notation $R_2$ uses numeral subscripts in connection with the standard notation R for radical groups to differentiate different types and/or instances of radical groups R, not to specify a number of radical groups R. So in the structure (2), the notation $R_2$ does not mean that there are two radical groups R. $R_2$ usually has an even number of carbon atoms, for example 2, 4, or 6. The fraction of unsaturation in the polymer may be influenced by the fraction of unsaturation in the feedstock for the bacteria. It should be noted that each instance of $R_1$ and $R_2$ can be different from a neighboring instance. For example, in one instance $R_1$ can have 3 carbon atoms, while in a neighboring instance $R_1$ has 4, 5, 6, or 7 carbon atoms. Likewise, in one instance $R_2$ can have 4 carbon atoms, while in a neighboring instance $R_2$ has 2 or 6 carbon atoms. Neighboring instances of $R_1$ can also have the same number of carbon atoms, and neighboring instances of $R_2$ can have the same number of carbon atoms.

Generally, PHAs can be produced by many types of bacteria in response to growth restriction by a nutrient other than the carbon source. *Pseudomonas oleovorans* is an example of a microorganism that produces PHAs with relatively long pendant side chains. *E. coli* and *Bacillus megaterium* are other bacteria that can produce PHAs. The long side chains may contain some functionalities, such as olefins, that may provide sites for chemical modifications.

The polymerization mixture may include a combination of vinyl-terminated fatty acid(s) and aliphatic fatty acid(s). Useful biorenewable vinyl-terminated fatty acids include 10-undecenoic acid, and multiple biorenewable vinyl-terminated fatty acids may be used in one reaction. The biorenewable fatty acids may be formed from one or more biorenewable plant oils, such as castor oil in the case of 10-undecenoic acid. Other examples of biorenewable plant oils include vegetable oils, soybean oil, and linseed oil.

Additional aliphatic fatty acids can be used in the PHA feedstock, allowing modification of polymer properties via various compositions (note: they are the fatty acids with the "$R_1$" and "$R_2$" groups in order to distinguish the two aliphatic fatty acids). Examples of aliphatic fatty acids may include butanoic acid, pentanoic acid, hexanoic acid, heptanoic acid, octanoic acid, nonanoic acid, decanoic acid, or undecanoic acid (among other alternatives). Ideally, these are derived from renewable sources.

A general reaction scheme for forming bio-based polymers having residual unsaturation for sulfur-reactive coatings is as follows:

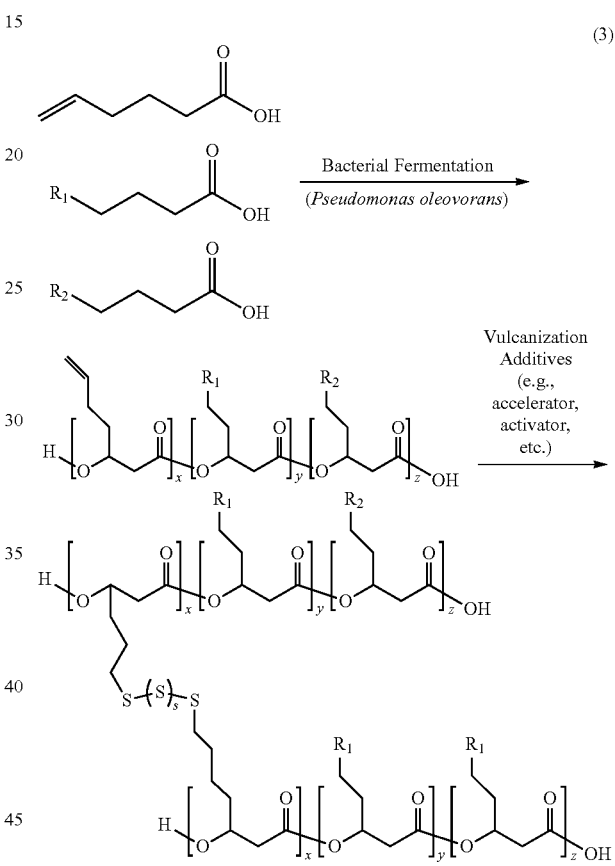

(3)

The PHA material with the vinyl-terminated side chain in formula (3) includes three portions: biorenewable vinyl-terminated fatty acid (x), the first aliphatic fatty acid with the terminal $R_1$ group (y), and the second aliphatic fatty acid with the terminal $R_2$ group (z), where x, y and z represent relative numbers of the various units in the polymer. The portions x, y, z may be adjusted by varying either or both the stoichiometric ratio(s) and reaction condition(s). Chain length(s), internal vinyl group(s), etc. affects properties such as glass transition temperature, melting temperature, and/or various materials characteristics (e.g., impact resistance, compression properties, etc.).

The bacteria are generally mixed into the feedstock to activate the fermentation process. In some cases, the fermentation is performed under various environmental limitations such as oxygen, nitrogen, phosphorus, and the like. Solvents may be used to aid in recovery of the polymer. To illustrate, *P. oleovorans* may be grown in the presence of the biorenewable vinyl-terminated fatty acid and the aliphatic fatty acids, and the resulting polymer may be extracted from lyophilized cells using chloroform and precipitated with methanol.

The PHA thus formed can be applied to a substrate to form a coating. Bacterial cultures can optionally be filtered or otherwise removed from the hydrocarbon liquor, which can be sprayed, spin coated, or ribbon coated onto the substrate to apply a polymer coating. The liquor can also be accumulated in a vessel and the substrate dipped in the liquor to coat. Alternately, a reactive mixture of hydrocarbons, as described above, and *P. oleovorans* can be provided to a reactive extruder, optionally with a solvent, to reactively extrude an unsaturated PHA polymer, which can be applied directly to a substrate to coat the substrate, or can be redissolved in a solvent for application to the substrate in any of the ways described above. Solvents that may be added to the polymer to tune the viscosity include tetrahydrofuran, chloroform, toluene, dioxane, dimethylaminopropane, other halogenated solvents, and other polar solvents.

The substrates are then dried to harden the polymer coating. Solvents and/or residual feedstocks may be recovered and recycled at the drying stage or at an intermediate stage. The result is typically an unsaturated polyester coating of 12.5 µm to 200 µm. FIG. 1 is a schematic cross-sectional view of a substrate 100 coated with a bio-based sulfur-reactive polymer coating 102 as described herein. The coating is conformal, with thickness varying no more than about 50% from the mean thickness over the substrate.

To increase the sulfur reactivity of the coating, a catalyst may be included in the coating precursor solution prior to application onto the substrate. Sulfurization catalysts are useful for this purpose. Also called accelerators, common types of accelerators are aldehyde amines, guanidines, thiazoles, thiophosphates, sulfenamines, thioureas, thiurams, dithiocarbamates, and xanthates. The faster accelerators, such as the thioureas, thiophosphates, thiurams, dithiocarbamates, and xanthates, sometimes called ultra-fast accelerators or ultra-accelerators, will scavenge sulfur from the environment more quickly and at lower temperatures. The temperature of the environment in which the substrate will be used can therefore guide selection of the catalyst. As is usual with sulfurization accelerators, more than one catalyst may be used. For example, in many sulfurization systems a "primary" accelerator such as a thiazole or sulfenamide, is used with a "secondary" accelerator such as a guanidine, thiuram, or dithiocarbamate to increase sulfur reactivity. Such mixtures of catalysts may be used in the sulfur reactive coatings described herein. Typical catalyst loadings in the finished coating are from 0.5 to 1.5 parts per hundred by weight, but more or less may be used for increased or decreased reactivity depending on the anticipated environment.

Examples of commonly used sulfurization accelerators that can be used in the coatings described herein include, but are not limited to, hexamethylene tetramine (HMT), heptaldehyde-aniline condensation product (HA), diphenyl guanidine (DPG), N,N'-diorthotolyl guanidine (DOTG), 2-mercaptobenzothiazole (MBT), 2,2'-dithiobis (benzothiazole) (MBTS, also called 2,2'-dibenzothiazyl disulfide), zinc-2-mercaptobenothiazole (ZBDP), 2-benzothiazolesulfenamide (BBTS), N-cyclohexyl-2-benzothiazole sulfenamide (CBS), N-tert-butyl-2-benzothiazole sulfenamide (TBBS), 2-(4-morpholinothio)-benzothiazole (MBS), N,N'-dicyclohexyl-2-benzothiazole sulfenamide (DCBS), ethylene thioureas (ETU), di-pentamethylene thiourea (DPTU), tetramethylthiuram monosulfide (TMTM), tetramethylthiuram disulfide (TMTD), dipentamethylenethiuram tetrasulfide (DPTT, which can also refer to the hexasulfide, or a mixture of the two), tetrabenzylthiuram disulfide (TBzTD), zinc dimethyldithiocarbamate (ZDMC), zinc diethyldithiocarbamate (ZDEC), zinc dibutyldithiocarbamate (ZDBC or BZ, which can also be mixed with zinc di-n-butylamine to form a mixture called ZBUDX), zinc dibenzyldithiocarbamate (also called ZDBC), and zinc isopropyl xanthate (ZIX). Activators are often included in sulfurization accelerator systems as well. Typical activators include zinc oxide and stearic acid. Such activators may be used in the coatings described herein as well.

The catalyst, along with any desired activators, is dissolved in any of the solvents listed above. The dissolved catalyst is then blended with the PHA solution prior to application to the substrate. As noted above, the PHA polymer may be dissolved or thinned in a solvent to improve mixing of the catalyst. To avoid uptake of environmental sulfur during preparation and application of the coating, the catalyst may be mixed with the PHA solution under a controlled atmosphere that is sulfur-free, for example under a nitrogen blanket. The coating may also be applied to the substrate under such a controlled atmosphere. Rheology controls and modifiers can be used to simplify application of the coating.

In one embodiment, 10-undecenoic acid is fermented, alone or with another hydrocarbon or organic material such as octanoic acid, in a culture of *P. oleovorans* to form polyundecenoic acid or poly(β-hydroxyoctanoic-co-undecenoic acid), which may be recovered as a solid or stored or used in solution directly. Homopolymerization of 10-undecenoic acid using *P. oleovorans* proceeds as follows:

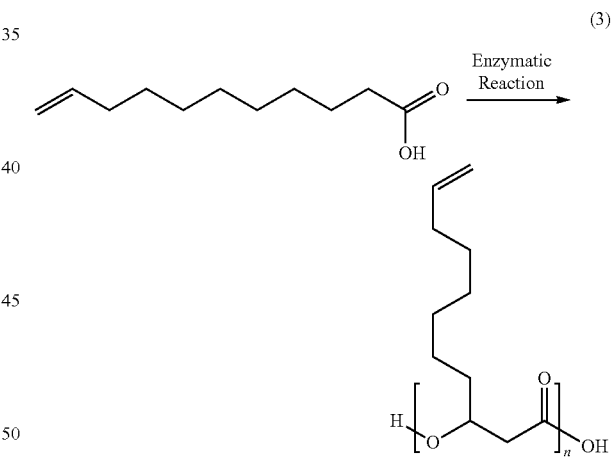

(3)

Primary undecenoic acid is a naturally derived feedstock that enhances the sustainability of the bio-based coating material, but any primary alkenoic acid of $C_6$ or higher may be used. The resulting polymer mixture is thinned with toluene, for example, and an ultra-accelerator from the list above, also optionally dissolved in toluene, with activators, is added to the mixture. The resulting catalyzed sulfur-reactive polymer solution is then conformally coated on a substrate by spraying, dipping, spin coating, ribbon coating, or another convenient method.

Depending on the environment the substrate will encounter, the catalyst system may be tuned to be fast or slow. For higher temperatures and more sulfur-containing environments, a slower catalyst system (slower catalysts and/or less activator) can be used since reactant concentrations and temperatures are higher, and vice versa. In high-sulfur environments, a thicker coating may be used to prevent sulfur penetration through the coating before a vulcanized skin develops on the coating. The catalyst system is selected, however, to impart sulfur reactivity to the coating at temperatures near ambient, for example at or below 40° C. Many of the ultra-accelerators can activate sulfurization of environmental sulfur at room temperature. A highly sulfur-reactive coating material may be made by making a bio-based polyester having unsaturation ratio of 1 (by fermenting 10-undecenoic acid using *P. oleovorans*) and blending the polymer with an ultra-fast sulfurization catalyst system.

The sulfur-reactive coating may be applied over another coating in some cases. A first coating, for example a silicone, epoxy, acrylate, and/or other organic coating commonly used for electronics may be applied to a substrate and hardened, and then a second coating of a bio-based, sulfur-reactive polymer may be applied over the first coating to provide a sulfur barrier. In another embodiment, the first and second coatings may be bio-based, and may be the same or different materials. For example, a first coating of an unreactive bio-based polymer may be applied to the substrate, and then a second coating of a sulfur-reactive bio-based polymer as described herein may be applied over the first coating. In other embodiments, the sulfur-reactive coating may be applied first followed by an unreactive coating. In other embodiments, a sulfur-reactive bio-based polymer as described herein may be blended with another polymer as a coating to provide sulfur barrier properties.

If the component being coated will be used in a sulfur-intensive environment and exceptional sulfur barrier properties are desired, the sulfur-reactive coating may be pre-sulfurized sulfurized to a desired extent to develop a sulfur-resistant skin on the outside of the coating prior to exposure to the sulfur-intensive environment. After forming the bio-based, sulfur-reactive coating, as described above, the coated substrate, for example an electronic component coated with the sulfur-resistant polymer coating, may be exposed to a sulfur-containing atmosphere to pre-sulfurize the coating. A nitrogen atmosphere loaded with elemental sulfur up to about 1 wt % may be used to add sulfur to the coating. The temperature may also be elevated slightly, up to about 50° C. for example, to improve sulfur uptake of the coating.

The pre-sulfurized surface may be disposed within the bulk of the coating, rather than at the surface, by forming a two-layer coating. A first coating of a sulfur-reactive polymer, which may be a highly sulfur-reactive coating, is applied to a substrate and pre-sulfurized. Then a second coating, which may be a barrier coating or a sulfur-reactive coating, is applied over the first coating.

Sulfur-resistivity of the coating may also be increased by increasing thickness of the coating. Using a thick coating, for example, a coating with thickness of 150-200 µm, with unsaturation ratio of 0.9 to 1.0, with ultra-fast catalyst system, and pre-sulfurizing the surface, will produce a highly sulfur-resistant coating having very high resistance to sulfur penetration even in high-sulfur environments having ambient atmospheric sulfur as high as 0.1 wt %.

Multi-coating systems are also contemplated having varying proportions and mixtures of sulfur-reactive, inert, and barrier coatings.

In some embodiments inert and/or reactive additives or process aids may be added to a sulfur-reactive, bio-based coating, including lubricants, nucleating agents, extension oils, organic and inorganic pigments, anti-oxidants and UV-protectors, inert additives, heat stabilizers, plasticizers, fillers, and coupling agents. For example, plasticizers such as dioctyl phthalate, dioctyl adipate, and triacetyl glycerol may be added to the coating precursor for inclusion in the coating. The plasticizers may be used to modify the thermal and mechanical properties of a PHA, such as glass transition temperature ($T_g$), melting temperature ($T_m$), degree of crystallinity, and mechanical properties such as modulus. In further embodiments, carbon and mineral fillers selected from the group including, but not restricted to: carbon black, graphite, carbon fiber, carbonate minerals, magnesium carbonate, hydromagnesite, huntite, hydroxide minerals, aluminum trihydroxide, magnesium hydroxide, brucite, boehmite, bauxite, borates, flame retardant synergists, clays, organoclays, and oxides of antimony may be used. In other embodiments, coupling agents may be used as plasticizers, reactive polymer modifying agents, and mineral filler surface modification agents. The coupling agent may modify the surface properties of the polymers so as to enhance mixing, lower friction, and/or increase chemical compatibility. Coupling agents may be selected from the group including, but not restricted to: silanes, titanates, zirconates, aluminates, carboxylic acids, inorganic and organic esters, and phosphates.

A bio-based polymer having residual unsaturation may be cross-linked to a desired extent before or after coating a substrate. For example, an unsaturated bio-based polymer such as those described above may be formed or dissolved in a solvent and a cross-linking initiator, such as a peroxide, added to cross-link the polymer chains using the pendant vinyl groups. All or a part of the vinyl groups may be cross-linked. In terms of the unsaturation ratio, r, defined above, the cross-linking process may reduce r to zero or to a number above zero. If the amount of initiator is limited, or if the initiator is quenched after a desired reaction period, vinyl groups may be preserved in the cross-linked polymer to provide sulfur scavenging, and ultimately sulfur barrier properties. In such cases, the unsaturation ratio r may be reduced from, for example, 0.4 to 0.2. Such techniques may be used to tune the mechanical properties of the coating without loss of sulfur scavenging capability by forming a coating with a first unsaturation ratio and then reducing the unsaturation ratio by partially cross-linking the coating.

A cross-linked bio-based polymer may be used as a first coating on a substrate in a two-coating system. A first unsaturated bio-based polymer may be made or dissolved in a solvent and a cross-linking initiator mixed into the solution, as described above. The solution may then be coated onto the substrate by any convenient method, including those described above, to form the first coating. The first coating may then be dried and cured to allow cross-linking to develop. Degree of cross-linking can be controlled in the first coating by adjusting the quantity of unsaturation in the bio-based polymer of the first coating.

A second coating may then be prepared as a sulfur-reactive, bio-based coating to apply over the first coating. Such a two-layer coating may provide additional environmental barrier properties, such as enhanced moisture and/or oxygen resistance, beyond the sulfur resistance of the sulfur-reactive coating. If the second coating is applied while curing of the first coating is underway, vinyl groups in the second coating may cross-link with vinyl groups in the first coating, thus forming covalent bonds between the first and second coatings. As noted above, the sulfur-resistant coating may also be applied as the first coating, and the cross-linked coating as the second coating. The functions of the two coatings may be tuned by adjusting the thicknesses of the two coatings. More pure barrier function may be achieved using a thicker cross-linked coating, while more sulfur reactivity may be achieved using a thicker sulfur-reactive coating.

The bio-based, sulfur-reactive polymers described herein may be made in a reactive extrusion process. In any zone or stage of a reactive extrusion process, synthesis and/or modification of the bio-based sulfur-reactive polymers may be achieved. In one embodiment, functional groups of the PHA may be reacted or copolymerized with other functional monomers, oligomers, and/or polymers, including, but not restricted to: alpha-beta unsaturated esters, acrylates, methacrylates, alkyl methacrylates, cyanoacrylates, acrylonitrile, acrylamides, maleimides, vinyl sulfones, vinyl sulfoxides, vinyl sulfones, vinyl ketones, nitro ethylenes, vinyl phosphonates, acrylonitrile, vinyl pyridines, azo compounds, beta-keto acetylenes, acetylene esters, polylactic acid, polyurethanes, polycarbonates, acrylonitrile butadiene styrene (ABS), polyesters, polyethers, and copolymers thereof; and/or any blend of polymers that are capable of bonding with the functional group or side-chain group. Such processes may be used to tune the mechanical properties and sulfur-reactivity of the resulting polymer.

Figure 1B:
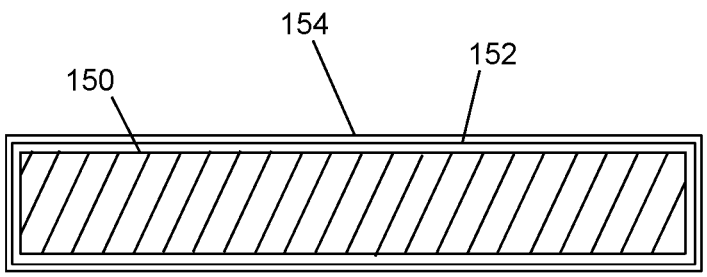
FIG. 1B is a schematic cross-section of an article with a sulfur-reactive coating according to another embodiment.

FIG. 1A is a schematic cross-section of an article 100 having a sulfur-reactive coating 102 applied thereto. The sulfur-reactive coating 102 is formed and applied to the article 100 by any of the methods described herein. The coating 102 may have a thickness of 12.5 μm to 200 μm, and may be any of the coatings, including the multi-layer coatings, described herein. The substrate may be any substrate to be protected from environmental sulfur. In one embodiment, the substrate is an electronic component, such as a printed circuit board, which may or may not have electronic components attached at bonding locations thereof. FIG. 1B is a schematic cross-section of another article 150 having a sulfur-reactive coating 152 applied thereto. The coating 152 is at least a two-layer coating, as denoted by the first layer 154 and the second layer 156. As a two-layer coating, the coating 152 may be any of the two-layer coatings described herein, with thicknesses and compositions described above.

While the foregoing is directed to embodiments of the present disclosure, other and further embodiments of the disclosure may be devised without departing from the basic scope thereof, and the scope thereof is determined by the claims that follow.

What is claimed is:
1. A method of processing an electronic component, comprising:
   mixing (a) a polyhydroxyalkanoate comprising sulfur-reactive substituents, (b) one or more of a sulfurization catalyst, accelerator, and activator, and (c) a solvent to form a coating material, wherein the polyhydroxyalkanoate is formed from a vinyl-terminated fatty acid or a combination of a vinyl-terminated fatty acid and an aliphatic fatty acid;
   applying the coating material to an electronic component; and
   removing the solvent to form a sulfur-reactive polymer coating that is resistant to sulfur penetration.
2. The method of claim 1, wherein the sulfur-reactive polymer coating has an unsaturation ratio of 0.01 to 1.

3. The method of claim 1, further comprising partially cross-linking the sulfur-reactive polymer coating to form a partially cross-linked sulfur-reactive polymer coating.
4. The method of claim 3, wherein the partially cross-linked sulfur-reactive polymer coating has an unsaturation ratio of at least 0.2.
5. The method of claim 1, further comprising pre-sulfurizing the sulfur-reactive polymer coating.
6. The method of claim 5, wherein pre-sulfurizing the sulfur-reactive polymer coating comprises exposing the electronic component having the sulfur-reactive polymer coating to a nitrogen atmosphere loaded with elemental sulfur up to about 1 wt %.
7. The method of claim 1, wherein the vinyl-terminated fatty acid has the structure

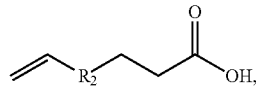

wherein $R_2$ is $(CH_2)_x$ and x is from 2 to 7.
8. The method of claim 1, wherein the vinyl-terminated fatty acid is a biorenewable vinyl-terminated fatty acid.
9. A method of processing an electronic component, comprising:
   mixing (a) a polyhydroxyalkanoate comprising vinyl containing substituents, (b) one or more of a sulfurization catalyst, accelerator, and activator, and (c) a solvent to form a coating material, wherein the polyhydroxyalkanoate is formed from a vinyl-terminated fatty acid or a combination of a vinyl-terminated fatty acid and an aliphatic fatty acid;
   applying the coating material to an electronic component; and
   removing the solvent to form a sulfur-reactive polymer coating that is resistant to sulfur penetration.
10. The method of claim 9, wherein the sulfur-reactive polymer coating has an unsaturation ratio of 0.01 to 1.
11. The method of claim 9, further comprising partially cross-linking the sulfur-reactive polymer coating to form a partially cross-linked sulfur-reactive polymer coating.
12. The method of claim 9, further comprising pre-sulfurizing the sulfur-reactive polymer coating.
13. The method of claim 12, wherein pre-sulfurizing the sulfur-reactive polymer coating comprises exposing the electronic component having the sulfur-reactive polymer coating to a nitrogen atmosphere loaded with elemental sulfur up to about 1 wt %.
14. The method of claim 9, wherein the vinyl-terminated fatty acid has the structure

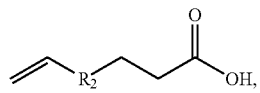

wherein $R_2$ is $(CH_2)_x$ and x is from 2 to 7.
15. The method of claim 9, wherein the vinyl-terminated fatty acid is a biorenewable vinyl-terminated fatty acid.

* * * * *